(12) United States Patent
Van Gastel

(10) Patent No.: US 7,272,887 B2
(45) Date of Patent: Sep. 25, 2007

(54) COMPONENT PLACEMENT DEVICE AND METHOD

(75) Inventor: Josephus M. M. Van Gastel, La Veldhoven (NL)

(73) Assignee: Assembleon N.V., La Veldhoven (NL)

( * ) Notice: Subject to any disclaimer, the term of this patent is extended or adjusted under 35 U.S.C. 154(b) by 0 days.

(21) Appl. No.: 10/563,578

(22) PCT Filed: Aug. 3, 2004

(86) PCT No.: PCT/IB2004/051370

§ 371 (c)(1),
(2), (4) Date: Jan. 6, 2006

(87) PCT Pub. No.: WO2005/013665

PCT Pub. Date: Feb. 10, 2005

(65) Prior Publication Data

US 2006/0162155 A1    Jul. 27, 2006

(30) Foreign Application Priority Data

Aug. 4, 2003    (EP) .................................. 03102423

(51) Int. Cl.
*B23P 19/00*    (2006.01)
(52) U.S. Cl. ............................ 29/740; 29/739; 29/741; 29/832
(58) Field of Classification Search ................. 29/739, 29/740, 832, 833, 741
See application file for complete search history.

(56) References Cited

U.S. PATENT DOCUMENTS 4,881,319 A * 11/1989 Yagi et al. .................... 29/840
5,035,047 A * 7/1991 Harigane et al. ............. 29/740
5,216,804 A    6/1993 Rosier et al.
5,377,405 A * 1/1995 Sakurai et al. ................ 29/833
5,855,059 A * 1/1999 Togami et al. ................ 29/740
5,864,944 A * 2/1999 Kashiwagi et al. ........... 29/833
5,894,657 A    4/1999 Kanayama et al.
6,148,511 A * 11/2000 Taguchi ........................ 29/834
6,408,505 B1 * 6/2002 Hata et al. .................... 29/740
6,606,790 B2 * 8/2003 Hidese ......................... 29/832
6,729,017 B1 * 5/2004 Kashiwagi et al. ........... 29/740
6,842,974 B1 * 1/2005 Maenishi et al. ............. 29/832

FOREIGN PATENT DOCUMENTS

DE    100 31 933 A1    4/2001
EP    0 514 975 A1    11/1992
EP    0 942 641 B1    1/2003

* cited by examiner

*Primary Examiner*—Carl J. Arbes
(74) *Attorney, Agent, or Firm*—Richard C. Peet; Foley & Lardner LLP

(57) ABSTRACT

A component placement device includes at least two component pick and place units, which are connected to a movable frame, and at least two component feeding devices. The component placement device is suitable for simultaneously picking-up components supplied, by means of the component feeding devices, by means of the component pick and place units. At least one component pick and place unit can be moved relative to the frame, which permits adjustment of the positions of the component pick and place units relative to one another.

11 Claims, 3 Drawing Sheets

COMPONENT PLACEMENT DEVICE AND METHOD

BACKGROUND

The invention relates to a component placement device that is provided with at least two component pick and place units, which are connected to a movable frame, and at least two component feeding devices. The component placement device is suitable for simultaneously picking-up, by means of the component pick and place units, components supplied by the component feeding devices. The invention also relates to a method for picking-up components by means of such a component placement device.

In a conventional component placement device, which is disclosed in European Patent Application No. EP-A 1-0092292, a number of component pick and place units can be moved collectively in X and Y directions between a number of adjacent component feeding devices and a substrate supported by a substrate support. The component pick and place units are separated by a certain pitch distance that is equal to the distance between the adjacent component feeding devices.

To place components on the substrate, the frame is moved to a position above the component feeding devices after which components are simultaneously picked-up from the component feeding devices by means of the adjacent component pick and place units. As the components are picked-up simultaneously, the time spent picking-up each of the components is relatively short. After the components have been picked-up by the component pick and place units, the frame is moved to a position above the substrate after which the components are simultaneously or sequentially placed on the appropriate positions on the substrate.

A drawback of such a conventional component placement device is that the components need to be supplied relatively accurately by means of component feeding devices, to ensure that the components can be picked-up simultaneously by the component pick and place units.

To complicate matters further, there has been a tendency over the past few years to reduce the size of components such that the dimensions of components that are to be picked-up by means of component pick and place units are in the order of 1 mm×½ mm or less. If the components are not supplied accurately, the components cannot be (or cannot not correctly be) picked-up simultaneously by means of the component pick and place units.

An object of the present invention to provide a component placement device that can be used to pick-up components simultaneously and accurately. Another object of the present invention is to provide a method for picking-up components, by means of a component placement device, simultaneously and accurately from component feeding devices.

SUMMARY

The first of the aforementioned objects is achieved by means of a component placement device according to the invention in that at least one component pick and place unit can be moved relative to the frame, while the mutual positions of the component pick and place units can be adjusted. By displacing at least one component pick and place unit relative to the frame, the mutual positions of the component pick and place units can be set. Moreover, the actual positions of the pick and place units may be adjusted to the expected mutual positions of the components to be picked-up. As a result, the components can picked-up simultaneously and accurately.

The mutual positions of the components to be picked-up can be determined prior to their being picked-up. Else, the mutual positions can be estimated statistically by means of components that have already been picked-up by the component placement device and the deviations between the estimated positions of the components relative to the associated component pick and place units and the actual positions of the components relative to the corresponding component pick and place units. Moreover, such deviations may be determined, for example, using a camera.

An embodiment of the component placement device according to the invention is characterized in that each component pick and place unit can be individually moved relative to the frame. As a result, it is possible for the frame to be used as a reference for all component pick and place units.

Another embodiment of the component placement device according to the invention is characterized in that a component pick and place unit can be moved relative to another component pick and place unit in a first direction. At the same time, the components that are to be supplied, by means of the component feeding devices, can be moved relative to one another in a second direction that extends transverse to the first direction.

By moving the pick and place units relative to one another in a first horizontal direction, for example, and moving the components relative to one another in a second horizontal direction, it is possible to displace the components and the pick and place units relative to each other in such a manner that components can be picked-up simultaneously and accurately from the component feeding devices by means of the component pick and place units.

The second of the aforementioned objects is achieved by the method according to the invention in that the components and the component pick and place units are set relative to each other prior to the simultaneous picking-up of the components. By setting the components and the component pick and place units relative to one another, it is possible to pick-up the components correctly and accurately by means of component pick and place units.

An embodiment of the method according to the invention is characterized in that at least one component pick and place unit is moved relative to the frame, so that the mutual positions of the component pick and place units are set. By moving at least one component pick and place unit relative to the frame, it is possible to set the mutual positions of the component pick and place units in such a manner that components can be picked-up accurately and simultaneously by the component pick and place units from the component feeding devices.

Another embodiment of the method according to the invention is characterized in that the positions of the components to be picked-up from the feeding devices are detected by a camera. Subsequently, the mutual positions of the component pick and place units are adjusted based on the mutual positions of the components to be picked-up. Thereafter, the components are picked-up by means of component pick and place units in a simultaneous and desired manner.

By detecting the positions of the components, which are to be picked-up from the component feeding devices, by means of a camera, the desired mutual positions of the component pick and place units can be determined. Then, by moving the component pick and place units relative to the frame to the required positions, it is subsequently possible to accurately and simultaneously pick-up components from the component feeding devices.

Another embodiment of the method according to the invention is characterized in that the positions of components picked-up by the component pick and place units are determined relative to the component pick and place units. At the same time, deviations between the desired positions and the actually determined positions of the components are determined relative to the component pick and place units. Thereafter, based on the deviations (if any), the component pick and place units are moved relative to one another prior to the picking-up of subsequent components.

By using information regarding the position of the components relative to the component pick and place units, which is necessary for example to accurately place the components on a substrate, no additional measurements need to be, carried out. Based on, for example, deviations between the desired position and the position actually found of a number of components successively picked-up by a component pick and place unit, it is possible for example to determine statistically the average deviation of a series of components fed by a specific component feeding device. As a result, the component pick and place unit associated with that specific component feeding device can be displaced relative to the frame prior to picking-up a subsequent component.

This method has the advantage that no time is required to measure the actual positions of the components by means of a camera. Moreover, the advantage of detecting the positions of components to be picked-up from the component feeding device by means of a camera is that it increases the accuracy with which the components can be picked-up.

It is to be understood that both the foregoing general description and the following detailed description are exemplary and explanatory only, and are not restrictive of the invention as claimed.

BRIEF DESCRIPTION OF THE DRAWINGS

These and other features, aspects, and advantages of the present invention will become apparent from the following description, appended claims, and the accompanying exemplary embodiments shown in the drawings, which are briefly described below.

DETAILED DESCRIPTION

Figure 1:
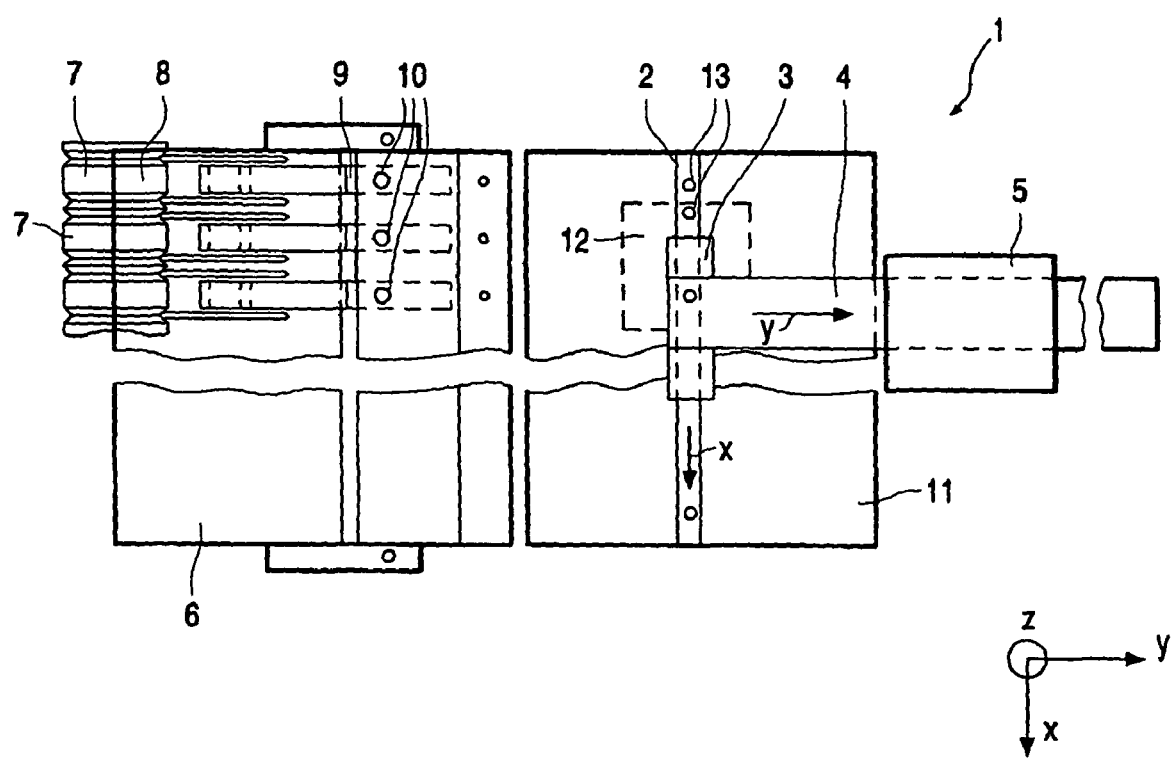
FIG. 1 is a top view of a first embodiment of a component placement device according to the invention.

Efforts have been made throughout the drawings to use the same or similar reference numerals for the same or like components.

FIG. 1 shows a component placement device 1 according to the invention. The device 1 is provided with a frame 2, which can be moved relative to a guide 3 in, a direction indicated by arrow x. The guide 3 is rigidly connected with a slide 4, which can be moved in, and opposite to, a direction indicated by arrow y and which, with an end facing away from the frame 2, runs in bearings in a support 5. The component placement device 1 is further provided with a component feeding system 6, which comprises a plurality of adjacent component feeding devices 7. Each component feeding device 7 comprises a spool 8 on which a tape 9 is wound. The tape 9 has a number of chambers disposed in a row, one component being situated in each chamber. The chambers are covered with a removable foil. Such a component feeding device and such tapes are known per se and will, therefore not be explained in further detail.

Each component feeding device comprises a component pick-up location 10 from which a component, transferred to this location, by means of a component feeding device, can be picked-up. The component placement device 1 further comprises a substrate support 11 for supporting and transporting substrates 12 (on which the components are to be placed) in the direction of arrow x. The frame 2 is provided with a number of adjacent component pick and place units 13, which are each provided with a suction nozzle (not represented) that is used to pick-up a component under vacuum. The suction nozzle can be displaced relative to the frame 2 in a direction z that extends transverse to the plane of the drawing. The component pick and place units 13 can be moved together with the frame 2 in, and opposite to the directions indicated by arrows x and y. Moreover, the component pick and place units 13 can be moved independently of each other relative to the frame 2 in, and opposite to, directions indicated by arrows x and y.

Figure 2:
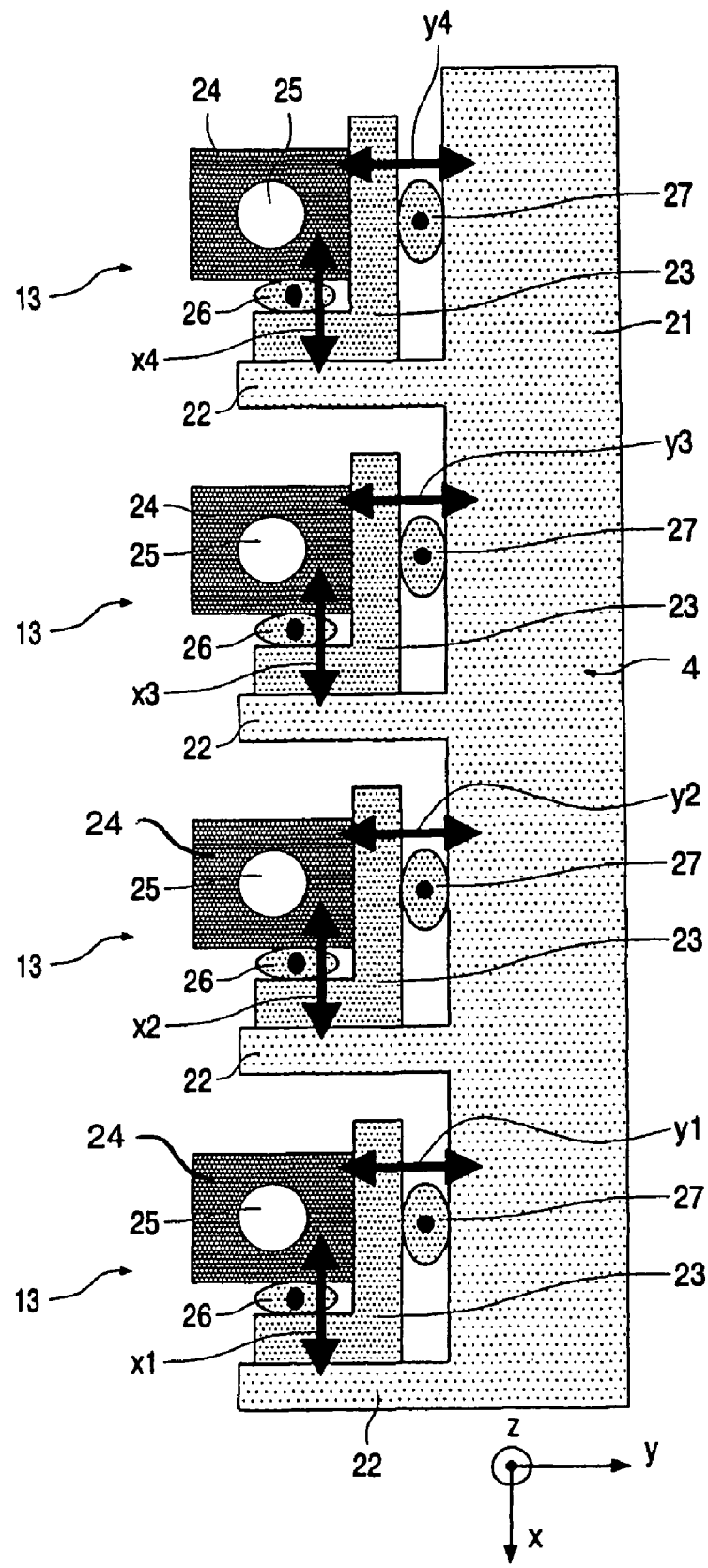
FIG. 2 is a top view of a part of the component placement device shown in FIG. 1.

FIG. 2 shows part of the slide 4 of the component placement device 1 represented in FIG. 1. The slide 4 comprises an elongated beam 21, which is provided with supports 22 that extend transverse to the beam. A component pick and place unit 13 is fitted to each support 22, which unit 13 is provided with an L-shaped guide 23 and a holder 24 supported by the L-shaped guide. A pipette 25, which can be connected to a vacuum source (not represented), is located in each holder 24. Each pipette 25 can be moved in a direction z that extends transverse to the plane of the drawing. The holders 24 can be moved individually relative to the associated L-shaped guide 23 by means of a respective actuator 26 in the directions indicated by the double arrows x1, x2, x3, x4, respectively. Each L-shaped guide 23 can be moved relative to the frame 2 by means of its own actuator 27 in the directions shown by the double arrows y1, y2, y3, y4, respectively. By means of the actuators 26, 27, which may comprise for example Lorenz actuators, threaded rod actuators, pinion rack actuators, piezo actuators and similar actuators, the pipette 25 of each component pick and place unit 13 can be set independently of the other pipettes 25 relative to the frame 2.

The operation of the component placement device 1 according to the invention is as follows. The frame 2 is driven in a y and x direction until the pipettes 25 are located above the component pick-up locations 10. By means of a camera, which is either permanently located above the component pick-up locations 10 or connected to the frame 2, the positions of the components that are to be picked-up are determined relative to the component pick-up locations 10. Subsequently, deviations between the expected positions of the components relative to the pick-up locations 10 and the actual positions relative to the pick-up locations 10, as detected by the camera, are determined by means of a processor. On the basis of the processor-determined deviations, the actuators 26, 27 of each component pick and place unit 13 are independently driven so that, after the pipettes 25 are displaced to the desired positions relative to the frame 2, components can be picked-up simultaneously from the locations 10 by means of the pipettes 25. Subsequently, the frame 2, together, with all related component pick and place units 13, is moved to a position above a substrate 12 on which the components supported by the pipettes 13 are then placed either sequentially or simultaneously. The pipettes are moved in the z direction relative to the frame 2, both when components are picked-up or displaced by means of the pipettes 25.

Figure 3:
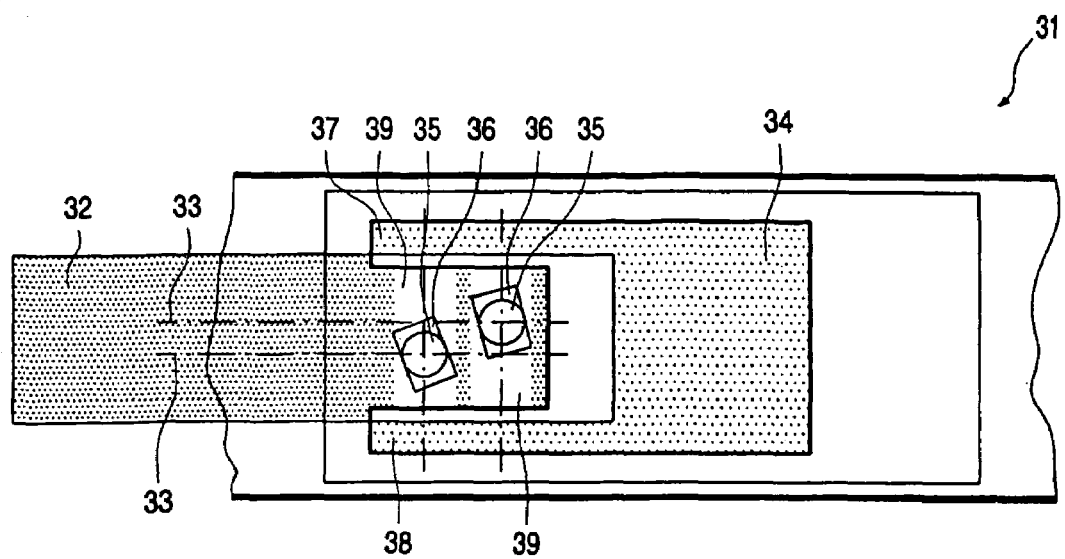
FIG. 3 is a top view of a part of a second embodiment of a component placement device according to the invention.
Figure 4:
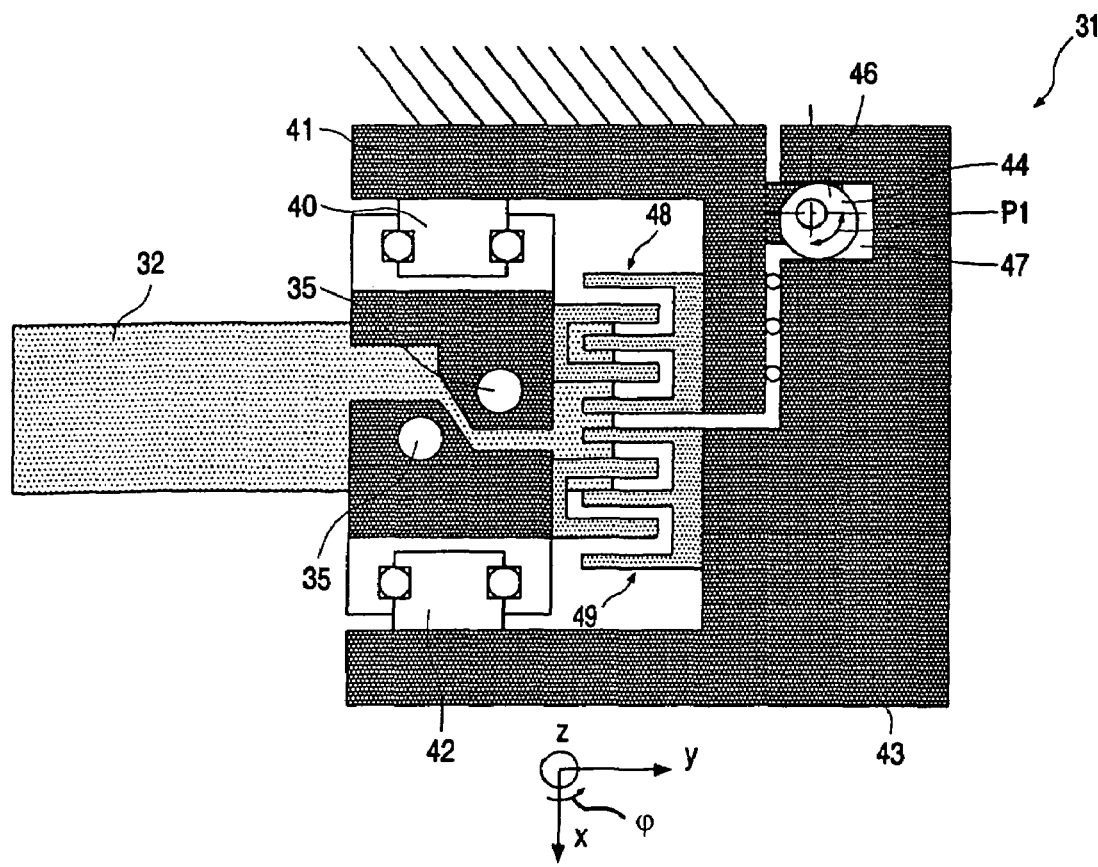
FIG. 4 is a top view of another part of the second embodiment of a component placement device according to the invention.

FIGS. 3 and 4 show top views of various parts of a second embodiment of a component placement device 31 according to the invention. The component placement device 31 includes a component feeding system 32 in which two component feeding devices 33 are located. These component feeding devices 33 are schematically represented by dashed lines. A component feeding system with relatively closely spaced component feeding devices is known in the industry under the name of Twin Tape Feeder (TTF) or multiple tape feeder with two or three component feeding devices. The component placement device 31 of this embodiment, however, further includes a laser alignment module (LAM) 34 that can be used to determine the position and orientation of components 36 picked-up by the pipettes 35. By means of the laser alignment module 34, laser beams are aimed from a first side 37 in a direction indicated by the arrow x to a second side 38 of the laser alignment module 34, which laser beams are schematically represented by the reference numeral 39.

As is clearly visible in FIG. 4, the component placement device 31 comprises two staggered pipettes 35 by means of which the components 36 can be picked-up simultaneously. By rotating the pipette 35 in a φ direction, which extends around the z axis, while the components 36 supported by the pipettes 35 are located in the laser beams 39, the amplitude and location of the received laser beam is constantly changed on the second side 38. Based on the laser beam received on the second side 38 and the orientation of the pipette 35, it is possible to determine the position of the component 36 relative to the associated pipette 35. A laser alignment module of the kind is known per se and will therefore, not be explained in detail.

As soon as the orientation and position of the components 36 relative to the pipettes 35 is known, the pipettes 35 can be moved together in the x and y directions to the location on the substrate on which the components 36 are to be placed. If the positions of the components 36 relative to the pipettes 35 deviate from the theoretically expected correct mutual alignments of the components 36 relative to the pipettes 35, the deviation is taken into account when the next pair of components 36 is picked-up. For this purpose, the pipettes 35 can be moved relative to one another and opposite to the direction indicated by the arrow x because one pipette 35 is connected to a frame 41 by means of a guide 40, whereas the other pipette 35 is connected to a slide 43 by means of a guide 42. The slide 43 is connected to the frame 41 and can be moved by means of an actuator 44 in, and opposite to, the direction indicated by arrow x. The actuator 44 comprises a shaft 46, which is eccentrically connected with the frame 41 and which is located in a recess 47 of the slide 43. By rotating the shaft 46 in, and opposite to, the direction of the arrow P1, the slide 43 and the connected pipette 35 are moved in the x direction. By means of the guides 40, 42, the pipettes 35 can be moved independently in, and opposite to, the z direction. For this purpose, the pipettes 35 are driven by the motors 48, 49.

The component feeding system 32 includes means for driving the corresponding component feeding devices in such a manner that the position of the component 36 to be picked-up can be adjusted in the y direction. If, after two components 36 have been picked-up, it is established, by means of the laser alignment module 34 that there are deviations between the measured positions of the components 36 relative to the pipettes 35 and the theoretically expected and desired positions of the components 36 relative to the pipettes 35 (i.e., a ΔX, ΔY of a first pipette 35 exists relative to the second pipette 35), the first pipette 35 is moved by means of the actuator 44 over the desired distance in the x direction relative to the second pipette 35 connected to the frame 41, when components 36 are again picked-up by the pipettes 35. In addition, the component that is to be fed, by means of one component feeding device 33, is shifted over a desired distance in the y direction relative to the other component to be supplied. After the components have again been picked-up, the orientations and positions of the components 36 relative to the pipettes 35 are again established by the laser alignment module 34. In this manner, after a number of subsequent component pick-ups, it is possible to determine a statistical error value by which the components are supplied by the different component feeding devices 33, thereby establishing deviations relative to one another between the theoretically expected positions and the actual positions. The advantage of thus measuring and correcting the positions in which the components are supplied and the pipettes 35 are positioned relative to one another, is that the speed at which the components can be picked-up and placed on the substrate is relatively high, and the accuracy with which the components are picked-up is considerably improved as compared to conventional component placement devices in which components are picked-up simultaneously.

It is alternatively possible to move only the component feeding devices in both the x and y directions relative to one another to achieve a correct and simultaneous pick-up by means of the component pick and place units.

It is also possible first to transfer the components by appropriate means to an intermediate position at which the components are suitably aligned to each other and from which the components may subsequently be picked-up simultaneously.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present invention. The scope of the present invention is to be defined as set forth in the following claims.

The invention claimed is:

1. A component placement device comprising:
   a movable frame;
   at least two component pick and place units that are connected to the movable frame; and
   at least two component feeding devices,
   wherein the component placement device is configured to simultaneously pick-up components, by the component pick and place units, supplied by the component feeding devices,
   wherein at least one component pick and place unit is configured to be moved relative to the frame such that the respective positions of the component pick and place units are adjusted, and
   wherein the at least one component pick and place unit is independently moveable relative to the frame in a direction equal to and opposite to a X-direction and in a direction equal to and opposite to a Y-direction, and wherein the X-direction is substantially perpendicular to the Y-direction.

2. The component placement device according to claim 1, wherein each component pick and place unit is configured to be moved relative to the frame.

3. The component placement device according to claim 1, wherein a first of the component pick and place units is configured to be moved, in a first direction, relative to a second of the component pick and place units while the components that are to be supplied by the component feeding devices are moved relative to one another in a second direction, and wherein the second direction is transverse to the first direction.

4. A method for picking-up components by a component placement device that is provided with a movable frame; at least two component pick and place units that are connected to the movable frame; and at least two component feeding devices, the method comprising the steps of:

setting components and the pick and place units relative to one another; and picking-up the components simultaneously using each of the component pick and place units, wherein at least one component pick and place unit is independently moveable relative to the frame in a direction equal to and opposite to a X-direction and in a direction equal to and opposite to a Y-direction and wherein the X-direction is substantially perpendicular to the Y-direction.

5. The method according to claim 4, further comprising the step of:

adjusting the positions of the component pick and place units by moving at least one component pick and place unit relative to the frame.

6. The method according to claim 4, further comprising the steps of:

detecting, using a camera, the positions of the components to be picked-up from the component feeding devices; and adjusting the positions of the component pick and place units on the basis of the positions of the components to be picked-up.

7. The method according to claim 4, further comprising the steps of:

determining actual positions of the components picked-up by the component pick and place units relative to the component pick and place units;

determining deviations, if any, between desired positions of the components and the actual positions of the components; and moving, based on the deviations, the component pick and place units relative to one another prior to the step of picking-up the components.

8. The method according to claim 4, further comprising the steps of:

moving the pick and place units relative to one another in a first direction; and simultaneously moving, by means of the component feeding devices, the components to be picked-up relative to one another in a second direction that extends transverse to the first direction.

9. A method for picking-up components by a component placement device that is provided with a movable frame; at least two component pick and place units that are connected to the movable frame; and at least two component feeding devices, the method comprising the steps of:

setting components and the pick and place units relative to one another;

picking-up the components simultaneously using each of the component pick and place units;

placing the components simultaneously on at least one substrate using each of the component pick and place units; and moving the component pick and place units relative to one another prior to the step of placing the components simultaneously on at least one substrate and after picking-up the components, and wherein at least one component pick and place unit is independently moveable relative to the frame in a direction equal to and opposite to a X-direction and in a direction equal to and opposite to a Y-direction and wherein the X-direction is substantially perpendicular to the Y-direction.

10. The method according to claim 9, wherein the components are placed on a single substrate.

11. The method according to claim 9, wherein the components are placed on two substrates adjacent each other.

* * * * *